United States Patent [19]

Oshima et al.

[11] Patent Number: 4,987,320
[45] Date of Patent: Jan. 22, 1991

[54] MULTIPHASE MULTIPLIER

[75] Inventors: Kenji Oshima, Narita; Yasutami Kito, Haruhi, both of Japan

[73] Assignee: Otis Elevator Company, Farmington, Conn.

[21] Appl. No.: 355,516

[22] Filed: May 22, 1989

[51] Int. Cl.$^5$ .................. H03K 5/22; H03K 5/00
[52] U.S. Cl. .................. 307/498; 307/240; 307/262; 328/28; 328/160
[58] Field of Search .............. 307/498, 499, 529, 271, 307/240, 262; 328/109, 15, 20, 28, 160, 142, 143

[56] References Cited

U.S. PATENT DOCUMENTS

| | | | |
|---|---|---|---|
| 3,466,460 | 9/1969 | Connolly | 328/160 |
| 4,034,304 | 7/1977 | Hallock | 328/160 |
| 4,599,567 | 7/1986 | Goupillaud et al. | 328/14 |
| 4,670,674 | 6/1987 | Kantorowicz et al. | 307/529 |

FOREIGN PATENT DOCUMENTS 0111736  9/1979  Japan .................. 328/160

Primary Examiner—Stanley D. Miller
Assistant Examiner—Richard Roseen
Attorney, Agent, or Firm—Breffni X. Baggot

[57] ABSTRACT

A multiphase multiplier circuit employs analog switches, each of which is duty controlled for multiplying input voltage signal with a multiplier determined depending on the duty cycle ON/OFF period. The multiphase multiplier circuit further includes means for multiplying a reference voltage signal by a desired factor for deriving the difference between the product and the factor for controlling duty cycles of the analog switches.

5 Claims, 2 Drawing Sheets

MULTIPHASE MULTIPLIER

BACKGROUND OF THE INVENTION

1. Field of the Invention

The present invention relates to a multiphase multiplier circuit for multiplying a plurality of analog voltage signals with a common multiplier value.

2. Description of the Background Art

Conventionally, LOG amplifiers, multiplier IC circuits, are known as analog multiplier circuits. Such conventional multiplier circuits amplify analog voltage signals representative of values to be multiplied at mu-factors corresponding to multipliers. These multiplier circuits generally comprise operational amplifiers and resistors to provide desired electrical characteristics, such as accuracy in arthimetic operation and response characteristics.

On the other hand, such conventional multiplier circuits have complicated circuit constructions which cause them to be relatively high in cost. Therefore, in the case of an apparatus using a plurality of multiplier circuits, it becomes necessary to provide the necessary number of multiplier circuits leading to a substantial cost in constructing the circuit. Such a problem may be encountered even in a multiphase multiplier circuit which amplifies a plurality of analog voltage signals with a common mu-factor, since a corresponding number of multiplier circuits are required.

SUMMARY OF THE INVENTION

Therefore, it is an object of the present invention to provide a multiphase multiplier circuit which has simplified construction.

Another object of the invention is to provide a multiphase multiplier circuit of a simplified construction which can maintain in accuracy, performance and response characteristics equivalent to the level of the conventional circuit.

In order to accomplish aforementioned and other objects and advantages, a multiphase multiplier circuit, according to the invention, employs analog switches for multiplying an input voltage signal with a multiplier signal by controlling the duty cycle of the switch. The multiphase multiplier circuit further includes a reference multiplier, including a switch, for multiplying a reference voltage signal by a multiplier signal and obtaining a product, summing the product with the multiplier signal to obtain an error signal, pulse width modulating the error signal, and feeding the pulse width modulated error signal back into the reference multiplier for the purpose of turning the switch on or off.

In further accord with the present invention, a multiplier circuit incorporates a plurality of multipliers and a reference multiplier. Each multiplier and reference multiplier contains a switch. Each multiplier receives an input signal. The reference multiplier receives a reference signal and obtains the product of that signal with a multiplier signal to sum the product with the multiplier. The resulting signal is pulse width modulated signal, and fed back into the switches contained in the multipliers and the reference multiplier switching them on or off thereby multiplying the input signals and reference signal by the multiplying signal.

Each of the multipliers may include an operational amplifier connected to the analog switch for receiving the input signal through the first analog switch, a feedback resistor and a filtering amplifier. In the preferred construction, each of the multipliers further includes an input resistor having a resistance cooperative with the feedback resistor for determining mu-factor for adjusting the multiplier. The duty cycle adjusting means may include a means for deriving the difference between the received output of the reference multiplier and a multiplier factor indicative signal to produce a difference indicative signal and a pulse generating means for generating a duty cycle control signal having a pulse width corresponding to the signal value of the difference indicative signal.

Preferably, the pulse generating means comprises a frequency signal source for generating a signal having a constant frequency and constant amplitude and a comparator which compares the frequency signal with the difference indicative signal for producing the pulse signal defining the duty cycle.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
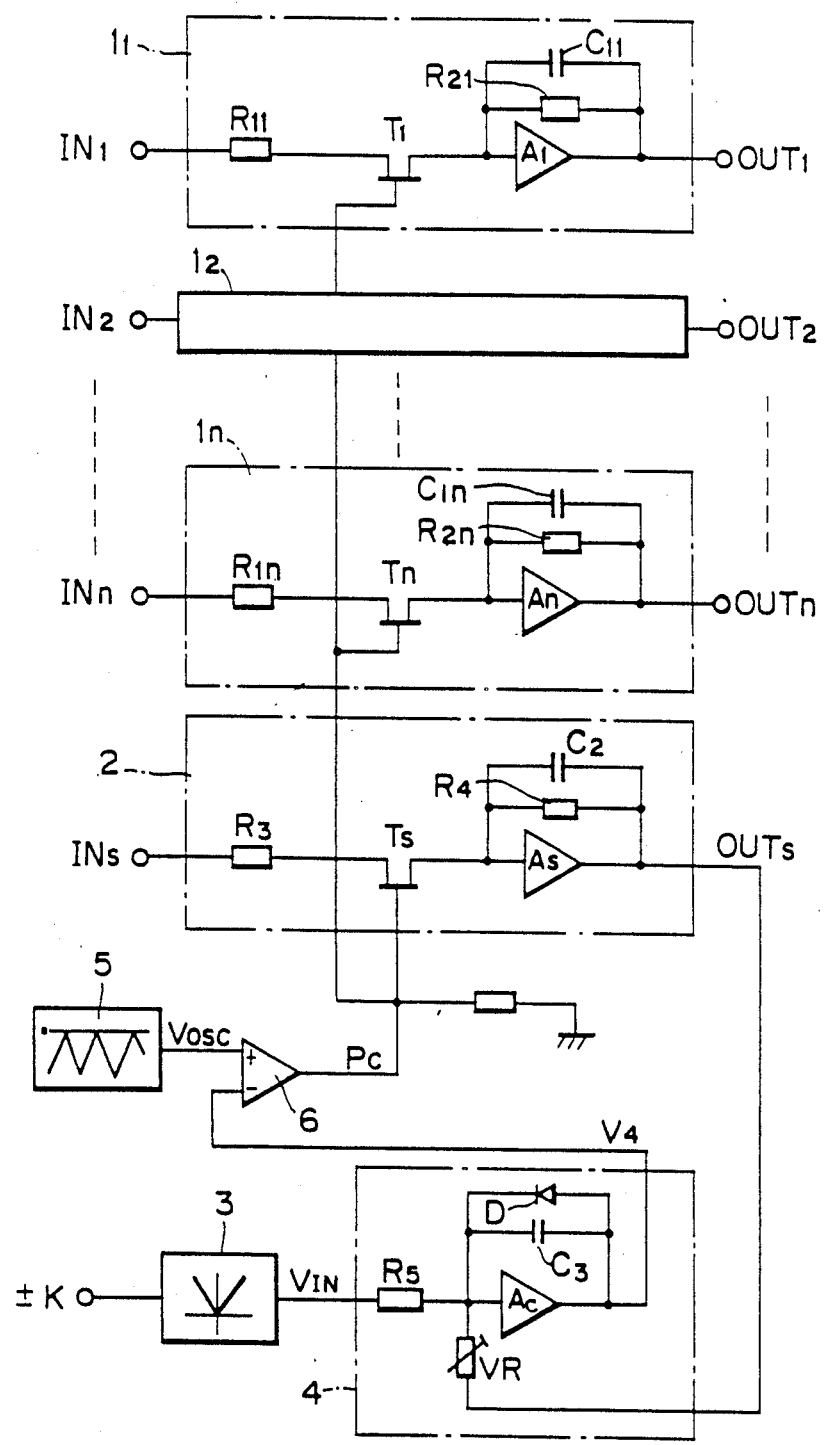
FIG. 1 is a circuit diagram of the preferred embodiment of a multiphase multiplier circuit according to the present invention.

Referring now to the drawings, FIG. 1 shows the preferred embodiment of a multiphase multiplier circuit, according to the invention, which has n-phase multipliers $1_1$ to $1_n$. The multipliers $1_1$ to $1_n$ have input terminals $IN_1$ to $IN_n$ which are respectively connected to field-effect transistors (FETs) $T_1$ to $T_n$ via input resistors $R_{11}$ to $R_{1n}$. The FETs $T_1$ to $T_n$ serve as analog switches whose ON/OFF periods are controlled.

The FETs $T_1$ to $T_n$ provide the input signals to operational amplifiers $A_1$ to $A_n$, outputs of which are connected to output terminals $OUT_1$ to $OUT_n$. The outputs of the operational amplifiers $A_1$ to $A_n$ are also connected to inputs thereof via feedback resistor $R_{21}$ to $R_{2n}$ and via filtering capacitors $C_{11}$ to $C_{1n}$. As seen from FIG. 1, the feedback resistors $R_{21}$ to $R_{2n}$ and the filtering capacitors $C_{11}$ to $C_{1n}$ are in parallel with their respective feedback resistors.

The preferred embodiment of the multiphase multiplier circuit also includes a reference multiplier 2. Similar to the multipliers $1_1$ to $1_n$, the reference multiplier 2 has an input terminal $IN_s$ which is connected to an operational amplifier $A_s$ via a series circuit comprising an input resistor $R_3$ and a FET $T_s$. The operational amplifier $A_s$ of the reference multiplier 2 has parallel feedback circuits, respectively, including feedback resistor $R_4$ and filtering capacitor $C_2$. The output of the operational amplifier $A_s$ is connected to an output terminal $OUT_s$ which in turn is connected to a control amplifier 4 which will be discussed herebelow, to feed the output of the operational amplifier $A_s$ as a feedback input for the control amplifier.

The control amplifier 4 includes a variable resistor VR connected to the output terminal OUT$_s$. The variable resistor VR is, in turn, connected to an operational amplifier A$_c$. The operational amplifier A$_c$ is also connected to an absolute value circuit 3 which receives a multiplier signal, an input K, representative of the factor by which the input voltages IN$_1$ to IN$_n$ will be multiplied. The absolute value circuit 3 outputs a positive polarity signal V$_{in}$ to the input of the operational amplifier A$_c$ via an input resistor R$_5$.

The operational amplifier A$_c$ has a primary delay capacitor C$_3$ and a positive polarity cut diode D. The operational amplifier A$_c$ is connected to inverting input terminal of a comparator 6. The comparator 6 has a non-inverting terminal connected to a triangular wave generator circuit 5 which generates a negative polarity triangular wave V$_{osc}$ having constant frequency and constant amplitude. The comparator 6 compares the output of the control amplifier V$_4$ the output of the triangular wave generator circuit 5 to produce a pulse signal Pc having a pulse width corresponding to the level of the output V$_4$ of the control amplifier 4 thus, the pulse signal Pc is a pulse width modulated V$_4$ signal. The pulse signal Pc is applied to the source of respective FET T$_s$ and T$_1$ to T$_n$ for turning the latter ON for a period corresponding to the pulse width of the pulse signal Pc.

The operational amplifier A$_c$ of the control amplifier 4 operates to determine the level of the output V$_4$ so that a balance between the output V$_{in}$ of the absolute value circuit 3 and feedback input V$_{osc}$ of the reference multiplier can be established.

With the circuit construction set forth above, the input voltages at the input terminals IN$_1$ to IN$_n$ of the multipliers 1$_1$ to 1$_n$ serve as signals representing values to be multiplied. On the other hand, the input K of the absolute value circuit 3 serves as a common multiplier. The absolute value circuit 3 outputs the absolute value signal V$_{in}$ corresponding to the input K. The operational amplifier A$_c$ receives the output, OUT$_s$, of the reference multiplier 2 generated in response to reference input IN$_s$ and the absolute value signal V$_{in}$ of the absolute value circuit 3. The operational amplifier then A$_c$ compares the inputs and outputs a negative polarity signal V$_4$ representative of the difference between the output OUT$_s$ of the reference multiplier 2 and the absolute signal V$_{in}$ of the absolute value circuit 3. The negative polarity signal V$_4$ is fed to the comparator 6. The comparator 6 compares the negative polarity signal value with the triangular wave signal of negative polarity input from the triangular signal generator circuit 5 to formulate a pulse signal Pc having a pulse width corresponding to the level of the negative polarity signal V$_4$. By this pulse signal Pc, duty cycle of the ON/OFF period of the FETs T$_s$ and T$_1$ to T$_n$ is controlled.

FIGS. 2(a) to 2(d) show waveforms of the signals in the preferred embodiment of the multiphase multiplier circuit of FIG. 1. As seen from FIG. 2(a), the reference input IN$_s$ for the reference multiplier 2 is held at constant voltage. On the other hand, the input V$_{in}$ of the control amplifier 4 increases according to increasing of absolute value of the input K, multiplier.

Figure 2:
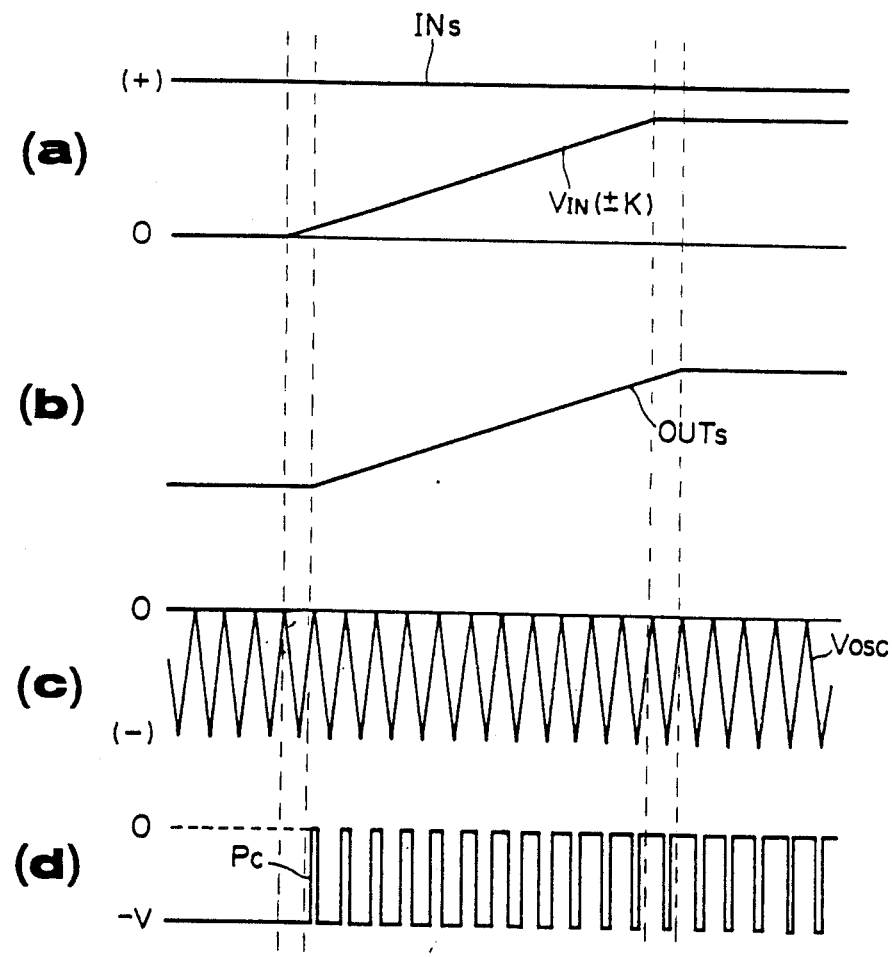
FIGS. 2(a) through 2(d) are charts showing waveforms of signals at different components of the preferred embodiment of the multiphase multiplier circuit of FIG. 1.

The output OUT$_s$ of the reference multiplier 2 is initially held zero. Therefore, the difference between output OUTs of the reference multiplier 2 and the output V$_{in}$ of the absolute value circuit 3 increases. Therefore, the level of the negative polarity signal V$_4$ of the operational amplifier A$_c$ is lowered from initial zero level. Since the ON/OFF period of the duty cycle of the FET T$_s$ is determined by the pulse width of the pulse signal Pc of the comparator 6 which increases according to lowering of the level of the negative polarity signal, the output OUT$_s$ increases (FIG. 2b). When the input K reaches the desired value and is held constant, the output OUT$_s$ of the reference multiplier 2 represents the product obtained by multiplying the reference input IN$_s$ by multiplier K. At this time, gain G of the system can be illustrated by:

$$G = V_{in}/IN_s = (1/IN_s) \times K$$

The forgoing equation can be modified when the resistance R$_{VR}$ of the variable resistor VR is varied, as follows:

$$G = (V_{in}/IN_s) \times (R_{VR}/R_5)$$

$$= (1/IN_s) \times (R_{VR}/R_5) \times K$$

When the multiplier gain, e.g. R$_{21}$/R$_{11}$, is same as the gain (R$_4$/R$_3$) in the reference multiplier 2, the relationship between inputs 1$_1$ to 1$_n$ and outputs OUT$_1$ to OUT$_n$ becomes the same as that in the reference multiplier 2. For example, the output OUT$_1$ of the multiplier 1$_1$ can be illustrated by:

$$OUT_1 = IN \times \{(1/IN_1) \times (R_{VR}/R_5)\} \times K$$

As can be appreciated from the above, of the FETs T$_1$ to T$_n$ and T$_s$ as being duty cycle controlled by the means of the ON/OFF period generated by the pulse signal Pc which performs chopping for obtaining multiplied outputs from the inputs IN$_1$ to IN$_n$ and IN$_s$. The duty cycle of these FETs T$_1$ to T$_n$ and T$_s$ is adjusted based on the difference between the output OUT$_s$ of the reference multiplier 2, as applied to the multiplier in feedback manner, and K. By this, the inputs IN$_1$ to IN$_n$ can be accurately amplified by a mu-factor corresponding to the input K multiplier. Therefore, the shown embodiment of the multiphase multiplier circuit can operate accurately.

In addition, since multipliers 1$_1$ to 1$_n$ and 2 perform the multiplying operation by chopper operation of the analog switches constituted by FETs T$_1$ top T$_n$ and T$_s$, leak current and offset level in each circuit can be kept low so that accurate multiplying operation becomes possible for substantially low level inputs. Furthermore, since the FETs T$_1$ to T$_n$ and T$_s$ of the analog switches are capable of high frequency switching operation, improved response characteristics in multiplying operation can be provided.

Furthermore, the multiplying gain in the preferred embodiment of the multiphase multiplier can be adjusted simply by adjusting the resistance of the variable resistor. If necessary, by adjusting the gain of each multiplier which can be done by adjusting resistances of the input resistor and feedback resistor, each multiplier can be adjusted independently of the other multipliers. With the construction and operation set forth above, the present invention fulfills all of the objects and advantages sought therefor.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims. For example, though the shown embodiment of the multiphase multiplier circuit employs the feedback circuit constituted by the control amplifier 4, the triangular wave generator circuit 5 and the comparator 6, for controlling the duty cycle for chopper operation, any circuit constructions of feedback circuit which can accurately adjust duty cycle can be employed. Furthermore, the circuit construction of the multiplier can be modified in any way as long as the capability of chopper operation is maintained.

What is claimed is:

1. A multiplier circuit, comprising;
   a plurality of multipliers, each responsive to a corresponding one of a plurality of input signals, including a reference signal, and each responsive to a duty cycle control signal for providing a plurality of corresponding multiplied input signals, including a multiplied reference signal; and
   a duty cycle adjusting means, responsive to said multiplied reference signal, for comparing the magnitude of said multiplied reference signal to the magnitude of a multiplier signal for providing said duty cycle control signal in proportion to the difference therebetween.

2. The multiplier circuit of claim 1, wherein each of said multipliers includes
   a switch, responsive to one of said input signals for providing a switched input signal; and
   an integrator, responsive to one of said switched input signals, for providing a corresponding of one of said multiplied input signals.

3. The multiplier circuit of claim 1, wherein said duty cycle adjusting means includes:
   a summing means, responsive to the magnitudes of said multiplied reference signal and said multiplier signal, for providing a difference signal proportional to the difference therebetween; and
   pulse generating means responsive to said difference signal for providing said duty cycle control signal.

4. A multiplier circuit, comprising;
   a plurality of multipliers, each responsive to a corresponding one of a plurality of input signals, including a reference signal, and each responsive to a duty cycle control signal for providing a plurality of corresponding multiplied input signals, including a multiplied reference signal; and
   a duty cycle adjusting means, responsive to said multiplied reference signal, for comparing the magnitude of said multiplied reference signal to the magnitude of a multiplier signal and providing said duty cycle control signal, said duty cycle adjusting means including
   a summing means, responsive the magnitudes of said multiplied reference signal and said multiplier
   signal, for providing a difference signal proportional to the difference therebetween; and
   pulse generating means, responsive to said difference signal, for providing said duty cycle control signal having a pulse width which is a function of the magnitude of said difference signal, wherein said pulse generating means includes
       a sawtooth signal source, for providing a sawtooth signal of constant amplitude and constant frequency; and
       a comparator, for comparing said sawtooth signal with the magnitude of said difference signal and providing said duty cycle control signal in proportion to the product therebetween.

5. A method of multiplying electrical signals, comprising:
   providing a plurality of voltages signals to a plurality of corresponding switches;
   switching each of said voltage signals on or off in response to a duty cycle control signal, thereby providing a plurality of corresponding switched voltage signals;
   integrating said switched voltage signals, thereby providing corresponding multiplied voltage signals;
   summing the magnitude of one of said multiplied voltages with the magnitude of a multiplier signal, thereby providing a difference signal;
   multiplying said difference signal with a sawtooth signal, thereby providing said duty cycle control signal.

* * * * *